(12) United States Patent
Wang et al.

(10) Patent No.: US 6,841,934 B2
(45) Date of Patent: Jan. 11, 2005

(54) WHITE LIGHT SOURCE FROM LIGHT EMITTING DIODE

(75) Inventors: Bily Wang, Hsin-Chu (TW); Jonnie Chuang, Taipei (TW); Yann Lee, Hsinchu (TW)

(73) Assignee: Harvatek Corporation, Hsin-Chu (TW)

(*) Notice: Subject to any disclaimer, the term of this patent is extended or adjusted under 35 U.S.C. 154(b) by 80 days.

(21) Appl. No.: 10/372,848

(22) Filed: Feb. 26, 2003

(65) Prior Publication Data

US 2004/0164675 A1 Aug. 26, 2004

(51) Int. Cl.[7] .................................................. H01J 1/62
(52) U.S. Cl. ........................ 313/512; 313/501; 313/506
(58) Field of Search ................................. 313/498, 501, 313/506, 508, 509, 512

(56) References Cited

U.S. PATENT DOCUMENTS 6,299,498 B1 * 10/2001 Liu et al. ..................... 445/24

* cited by examiner

*Primary Examiner*—Vip Patel
(74) *Attorney, Agent, or Firm*—Rosenberg, Klein & Lee

(57) ABSTRACT

A white light source is obtained by converting short wavelength color light emitted from a light emitting diode (LED). The conversion is achieved by covering the LED chip with a fluorescent glue. The LED chip is mounted on a split substrate, and the outer ends of the substrate serve as terminals for the LED. A wall may be erected around the LED chip to contain the fluorescent glue, and another transparent glue may be used to cover the fluorescent glue for protection.

9 Claims, 8 Drawing Sheets

WHITE LIGHT SOURCE FROM LIGHT EMITTING DIODE

BACKGROUND OF THE INVENTION (1) Field of the Invention

This invention is related to a light emitting diode (LED), particularly to a LED package for emitting white light.

(2) Brief Description of Related Art

FIG. 1 shows a prior art LED package. An LED chip 10 is mounted on the left side of a substrate. The substrate is split in the middle with a gap into a left hand section 11 and a right hand section 12. The bottom electrode of the LED chip 10 is mounted on the left hand section 11, and the top electrode of the LED chip 10 is wire bonded by wire 13 to the right hand section 12. The extensions of sections 11 and 12 serve as terminals for surface mounting of the LED package. The substrate and the chip 10 are encapsulated in a sealing glue 16 as shown in the side view FIG. 2. A through hole 15 and a cut 14 are inserted in the substrate for the glue to fill for stronger adhesion. Since an LED normally can emit only color light, the light emitted from the package cannot emit white light.

SUMMARY OF THE INVENTION

An object of this invention is to use an LED to generate white light. Another object of this invention is to reduce the height of an LED package. Still another object of this invention is to protect the LED from contamination.

These objects are obtained by using a short wavelength light emitting diode. A thin layer of fluorescent glue covers the top and peripheral of the light emitting diode. The LED normally emits short wavelength color light, such as blue, purple, blue-purple or UV color light, other than white light. The fluorescent glue converts the short wavelength color light into white light. The fluorescent glue also seals the package against contamination and strengthens the package structurally.

BRIEF DESCRIPTION OF THE DRAWGINGS

DETAILED DESCRIPTION OF THE INVENTION

FIGS. 3–7 show the construction of the LED package as a white light source.

Figure 1:
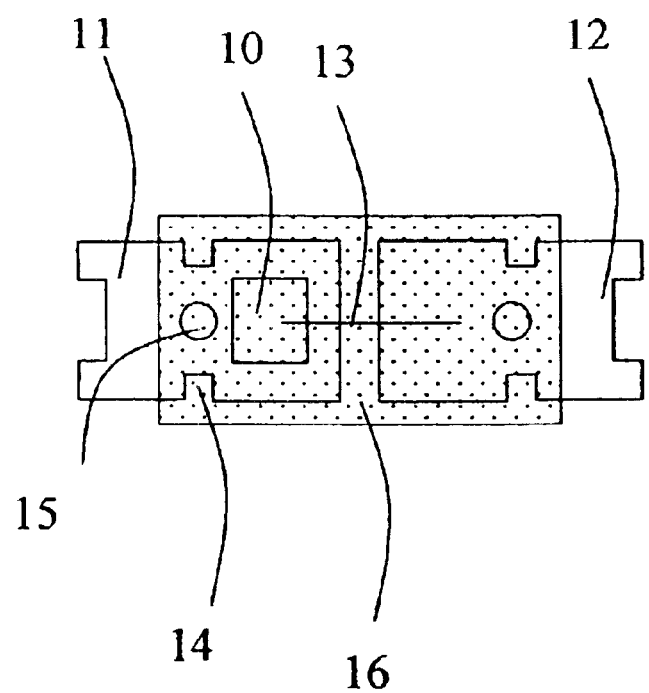
FIG. 1 shows the top view of a prior art LED package.
Figure 2:
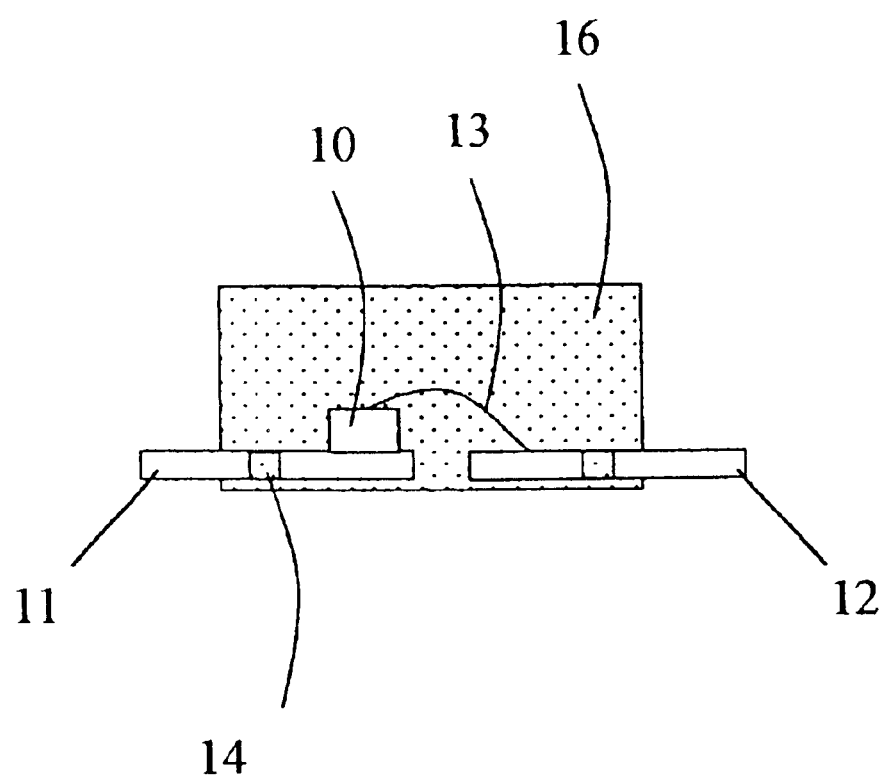
FIG. 2 shows the side view of a prior art LED package.
Figure 3:
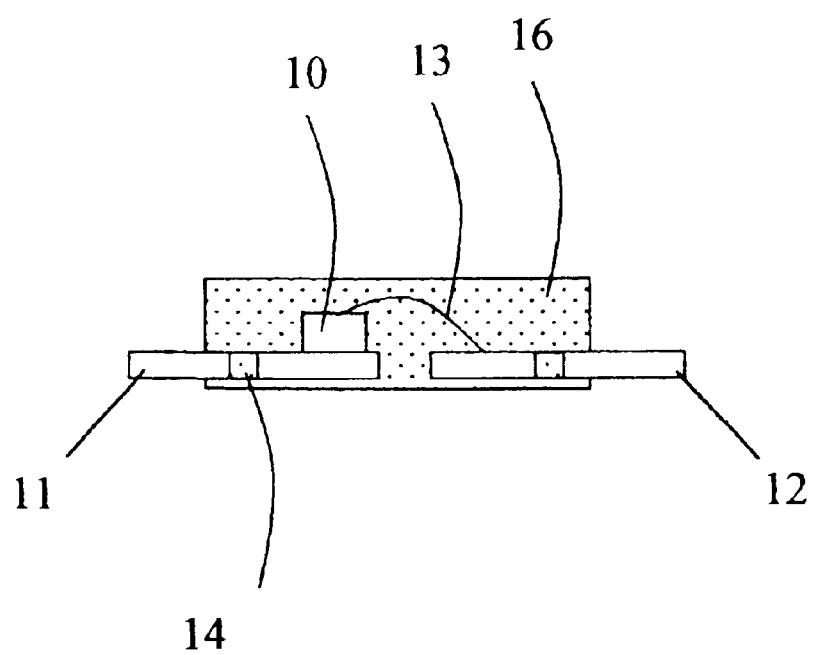
FIG. 3 shows the basic structure of the LED package of the present invention.

FIG. 3 shows the side view of the basic structure of the present invention. A short wavelength color LED 10 is mounted on the left section 11 of a metal substrate, which is split with a right hand section 12. The top electrode of the LED 10 is wire bonded by wire 13 to the right section 12. The LED chip 10 and the metal sections 11 and 12 are sealed with a fluorescent glue 16. The fluorescent glue coverts the color light emitted from the LED 10 into white light. The metal section sections 11 and 12 have through holes 14 for the fluorescent glue to flow through during sealing, thus strengthening the structure. The extensions of sections 11 and 12 are not covered by the fluorescent glue 16 to serve as terminals of the LED for surface mounting.

Figure 4:
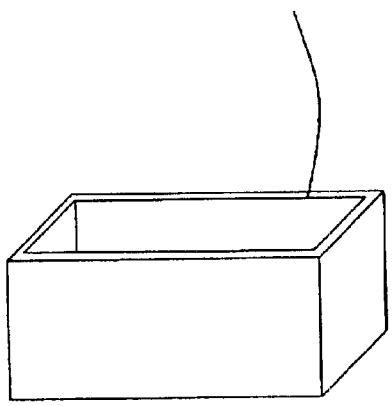
FIG. 4 shows a wall for the LED package.
Figure 4:
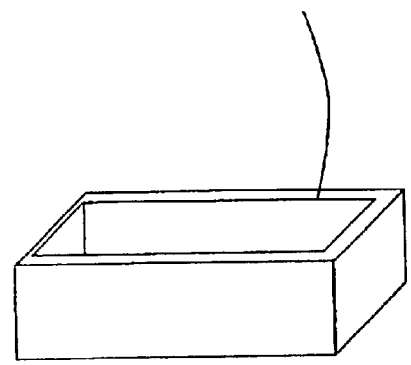
Figure 4:
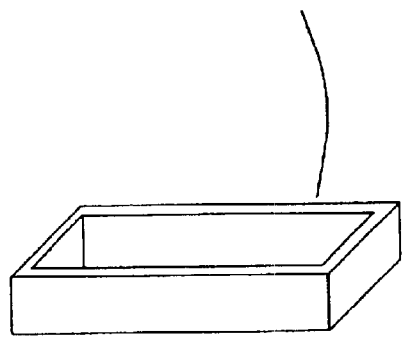

FIG. 4 shows a wall 25 for surrounding the LED chip shown in FIG. 3. The wall 25 can be of equal height as or unequal height as the fluorescent glue 16. Wall 25 is of equal height. Wall 251 is of taller height. Wall 252 is of shorter height.

Figure 5:
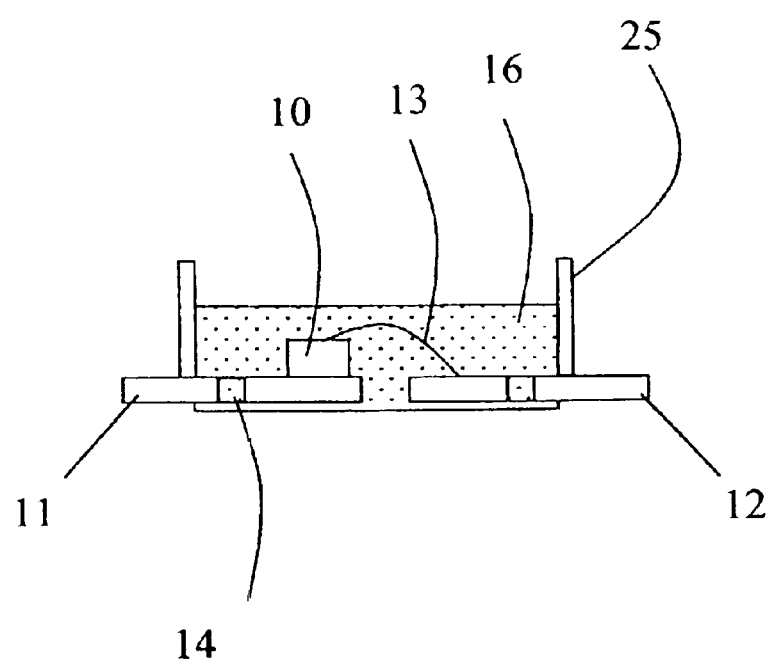
FIG. 5 shows the wall shown in FIG. 4 surrounding the LED chip.

FIG. 5 shows the wall 25 erected outside the fluorescent glue 16 shown in FIG. 3. In this figure, the wall is taller than the fluorescent glue 16.

Figure 6:
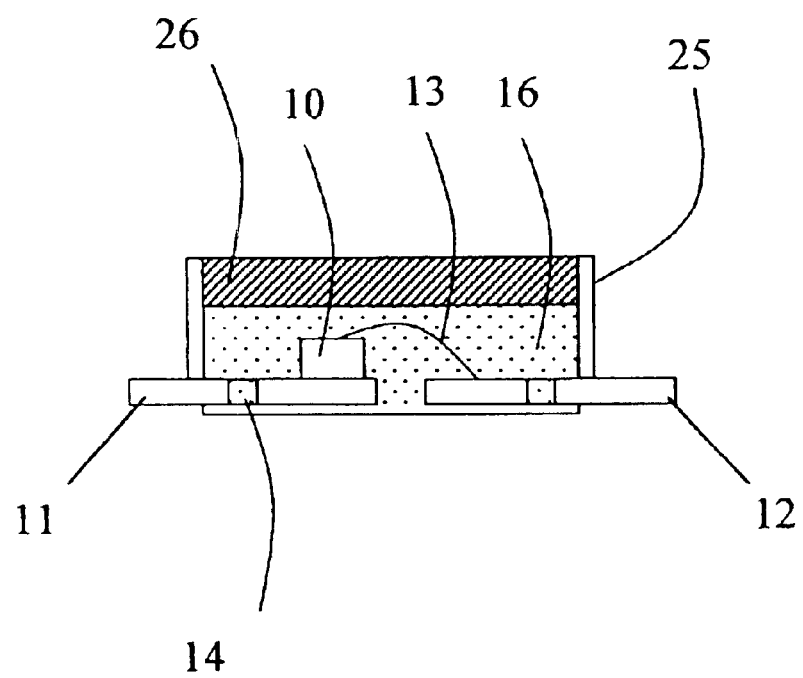
FIG. 6 shows a transparent glue covering the fluorescent glue.

FIG. 6 shows a wall 25 taller than the fluorescent glue 16 to provide space for a transparent glue 26 to fill over the fluorescent glue 16 for protection of the fluorescent glue 16.

Figure 7:
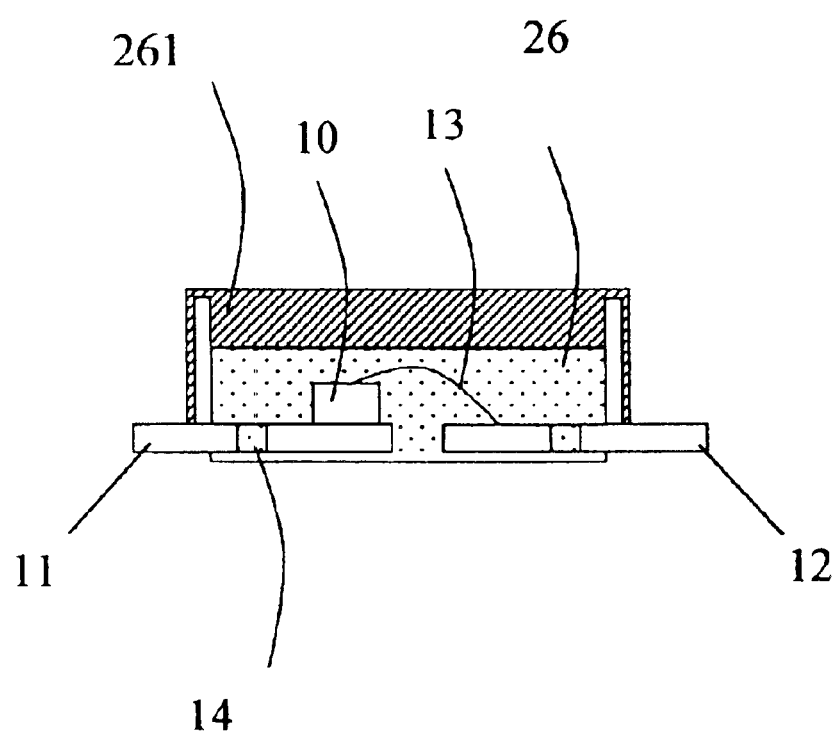
FIG. 7 shows the transparent glue covering the side and top of the LED package.

FIG. 7 shows another embodiment where the transparent glue also covers the outside surface of the wall to strengthen the structure as a layer 261.

Figure 8:
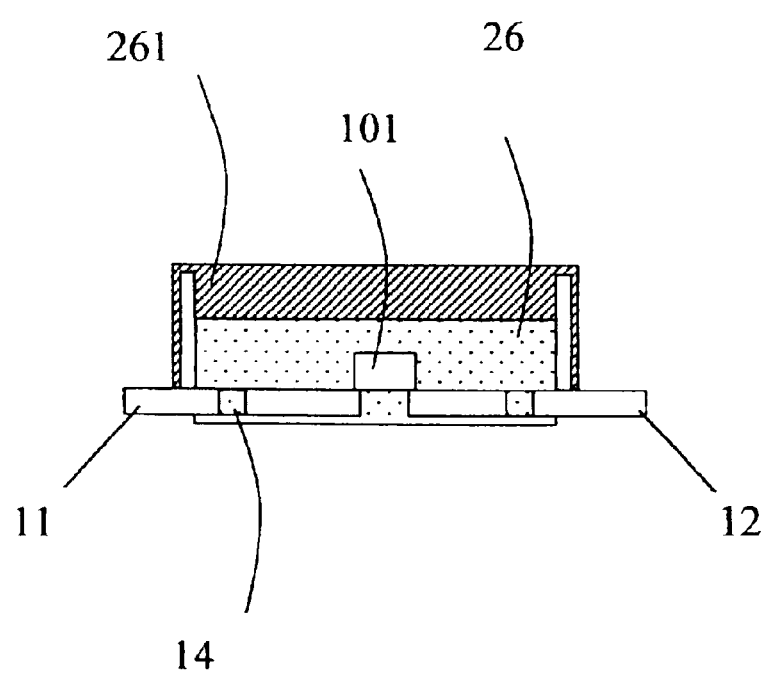
FIG. 8 shows a package for flip-chip LED.

FIG. 8 shows a package for a flip-chip LED 101. The LED chip 101 has two bottom electrodes, in contact with said first metal section 11 and said second metal section 12, respectively. Other parts of the package are the same as that shown in FIG. 7.

The LEDs described in FIGS. 3–7 are short wavelength LEDs selected from the group, consisting of blue light LEDs, purple light LEDs, blue-purple light LEDs, and ultra-violet light LEDs While the preferred embodiment of the invention have been described, it will be apparent to those skilled in the art that various modifications can be in the embodiments without departing from the spirit of the resent invention. Such modifications are all within the scope of the present invention.

What is claimed is:

1. A light emitting diode (LED) white light source, comprising:

a light emitting diode chip having a bottom electrode and a second electrode, and emitting short wavelength color light;

a split metal substrate having a first metal section and a second metal section, separate from each other, wherein said first metal section is mounted with said bottom electrode and said second section is connected to said second electrode;

a fluorescent glue, covering said LED chip and inner ends of said first section and said second section, and converting said short wavelength color light into white light, and terminals for said LED formed by the outer ends of said first metal section and said second metal section, not covered by said fluorescent glue.

2. The LED white light source as described in claim 1, further comprising at least one through holes in said first metal section and said second metal section for said fluorescent glue to fill and to strengthen the adhesion between the fluorescent glue and said substrate.

3. The LED white light source as described in claim 1,further comprising a wall erected around said fluorescent glue to contain said fluorescent glue.

4. The LED white light source as described in claim 3, wherein said wherein said wall is of unequal height as said fluorescent glue.

5. The LED white light source as described in claim 4, further comprising a transparent glue covering said fluorescent glue to protect said fluorescent glue.

6. The LED white light source as described in claim 5, wherein the transparent glue also covers the outside of said wall.

7. The LED white light source as described in claim 1, wherein said LED is selected from the group consisting of short wavelength blue light, purple light, blue-purple light, and ultraviolet light.

8. The LED white light source as described in claim 1, wherein said second electrode is a top electrode wire bonded to said second metal section.

9. The LED white light source as described in claim 1, wherein said second electrode is a second bottom electrode in contact with said second metal section.

* * * * *